(12) United States Patent
Ueki

(10) Patent No.: US 7,443,899 B2
(45) Date of Patent: Oct. 28, 2008

(54) SURFACE EMITTING SEMICONDUCTOR LASER DIODE AND MANUFACTURING METHOD THEREOF

(75) Inventor: Nobuaki Ueki, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 400 days.

(21) Appl. No.: 10/986,038

(22) Filed: Nov. 12, 2004

(65) Prior Publication Data
US 2005/0265412 A1 Dec. 1, 2005

(30) Foreign Application Priority Data
May 28, 2004 (JP) .............................. 2004-158747

(51) Int. Cl.
*H01S 5/00* (2006.01)
(52) U.S. Cl. .............................. 372/46.01; 372/46.013; 372/43.01
(58) Field of Classification Search .............. 372/43.01, 372/46.01
See application file for complete search history.

(56) References Cited

U.S. PATENT DOCUMENTS

| | | | | |
|---|---|---|---|---|
| 5,314,838 A | * | 5/1994 | Cho et al. ...................... | 438/32 |
| 5,478,774 A | * | 12/1995 | Ackley et al. .................. | 438/39 |
| 5,557,064 A | * | 9/1996 | Isern-Flecha et al. ......... | 174/393 |
| 5,717,710 A | * | 2/1998 | Miyazaki et al. ............ | 372/50.11 |
| 5,838,715 A | * | 11/1998 | Corzine et al. ................. | 372/96 |
| 6,483,127 B2 | * | 11/2002 | Saeki ........................... | 257/96 |
| 7,075,961 B2 | * | 7/2006 | Steinle et al. ............ | 372/43.01 |
| 2003/0185267 A1 | * | 10/2003 | Hwang et al. .................. | 372/96 |
| 2004/0114652 A1 | * | 6/2004 | Yoshikawa .................... | 372/46 |

FOREIGN PATENT DOCUMENTS

| JP | 3116088 B2 | 10/2000 |
|---|---|---|
| JP | 168854 A | 6/2003 |

OTHER PUBLICATIONS

Kenichi Iga; "Semiconductor Laser"; Ohmsha; 1990; pp. 156-181.
Chih-Hao Chang et al.; "Parasitics and Design Considerations on Oxide-Implant VCSELs"; IEEE Photonics Technology Letters; vol. 13; No. 12; Dec. 2001; pp. 1274-1276.

* cited by examiner

*Primary Examiner*—Minsun Harvey
*Assistant Examiner*—Patrick Stafford
(74) *Attorney, Agent, or Firm*—Sughrue Mion, PLLC

(57) ABSTRACT

A surface emitting semiconductor laser diode includes a substrate, a first reflective layer formed over the substrate, an active layer formed over the first reflective layer, a second reflective layer formed over the active layer, a first conductive layer having an opening therein and formed over the second reflective layer, and an additional reflective layer formed over the second reflective layer so as to cover the opening, wherein the additional reflective layer is covered, at least at a portion thereof, with a second conductive layer.

13 Claims, 6 Drawing Sheets

FIG. 6A (RELATED ART)
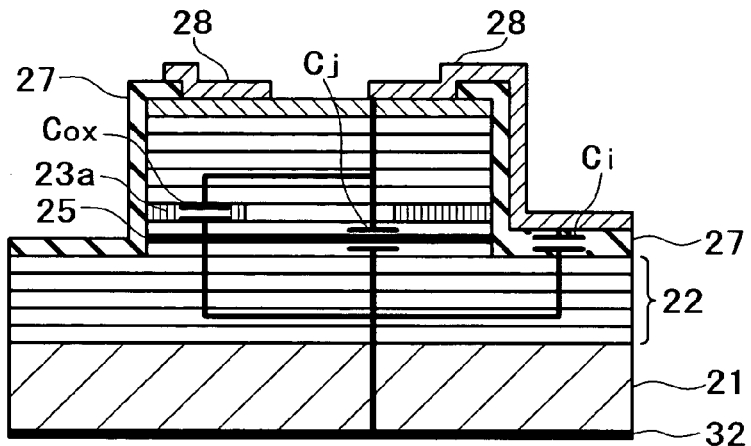
FIG. 6B
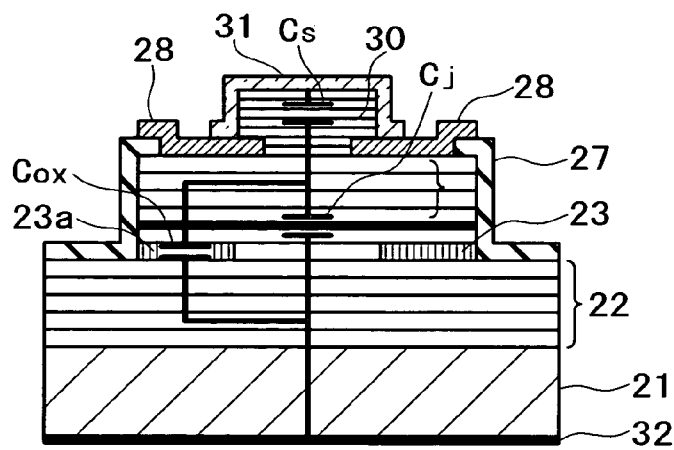
FIG. 7
|  | OPTICAL REFRACTIVE INDEX | RELATIVE DIELECTRIC CONSTANT | FILM THICKNESS |
|---|---|---|---|
| $TiO_2$ | 2.4 | 100 | 88.5nm |
| $SiO_2$ | 1.45 | 4 | 146.6nm |

SURFACE EMITTING SEMICONDUCTOR LASER DIODE AND MANUFACTURING METHOD THEREOF

BACKGROUND OF THE INVENTION

1. Field of the Invention

The present invention relates to a surface emitting semiconductor laser diode used as a light source for optical data processing or high-speed optical communication and a manufacturing method of the laser diode.

2. Description of the Related Art

In the technical field of the optical communication or optical recording, there has been a lot of interest in a surface emitting semiconductor laser diode (Vertical-Cavity Surface-Emitting laser diode, which will hereinafter be abbreviated as VCSEL) in recent years.

The VCSEL is characterized in that its power consumption is low owing to a low threshold current, a circular optical spot is easily available, and evaluation in the stage of wafer and two dimensional array of a light source can be achieved. These are excellent characteristics which the conventional edge emitting laser diodes do not have. On the other hand, the VCSEL cannot readily yield a high optical output exceeding 10 mW when it is used solely because "the volume of its active region is small" which is also a cause for the low threshold current. In addition, it has a device resistance typically from dozens to hundreds of Ohms, which is remarkably higher than that of the edge emitting laser diode (several Ohms).

The optical communication via an optical fiber has been employed for medium or long distance (from several to dozens of kilometers) data transmission. A combination of a single mode optical fiber made of silica and a laser having an oscillation peak in a long wavelength region of 1.31 µm or 1.55 µm has been used for it. They are light sources having excellent characteristics such as "low dispersion in the fiber or considerably small transmission loss", but involve many problems. For example, they need the temperature control of the device and take time for alignment of optical axes between the optical fiber and laser. Since telecommunication carriers are main users and therefore, the production is carried out on a small scale compared with that for the consumer product, the system itself is inevitably expensive.

In recent years, the widespread of asymmetric digital subscriber line (ADSL) and cable television (CATV) at home has made it possible to transmit data having ten times to hundred times the capacity of the conventional data. Use of the Internet is expected to increase further in future. There will be an increasing demand for high-speed and high-capacity data transmission and undoubtedly, the optical fiber will be commonly used at home in some day.

It is, however, uneconomical to employ a combination of a single mode type optical fiber and a distributed feedback (DFB) laser, which has been used for the medium- or long-distance communication, for example, for a few meters to dozens of meters data transmission between home and a telephone pole. For such short-distance communication (several to hundreds of meter), a low cost optical fiber such as a multi-mode type silica fiber or a plastic optical fiber (POF) can be used economically. The light source to be used for such a multi-mode type optical fiber therefore must satisfy the following requirements: the device itself is inexpensive and in addition, it does not need a special optical system or a driving system. A surface emitting laser is therefore one leading option capable of satisfying these requirements.

In the local area network (LAN) which is an indoor network, its transmission speed of data starting at ten megabits per second (Mbps) has increased to hundreds of megabits per second. Recently, the data transmission speed of 1 gigabit per second has appeared. It will really reach ten gigabits per second in near future. An electrical interconnection using a twist pair cable can be applied to the transmission speed up to 1 gigabit per second. At a data transmission speed exceeding 1 gigabit per second, however, it will be replaced with optical interconnection in consideration of the limit of noise tolerance.

There is an active movement to adopt the VCSEL for a light source of the optical interconnection used in the Ethernet (trademark) of 10 gigabits per second and its development has already begun. As explained above, no problem exists in the modulation at several GHz, but some measures must be taken to heighten the response characteristics to 10 GHz or greater.

A theoretical review of the modulation band of a laser diode is described in detail, for example, in "Semiconductor Laser", ed. by Kenichi Iga, Ohmsha, 1990". A relaxation oscillation frequency ($f_r$) which provides an indication of an improvement of the modulation band is derived by the following equation (1) based on the rate equation.

$$f_r = \frac{1}{2\pi} \sqrt{\frac{\xi G' P_{out}}{\eta_d \hbar \omega_o V_m}} \quad (1)$$

In the equation, $\xi$ is an optical confinement coefficient, $G'$ is a derivation gain coefficient, $P_{out}$ is an optical output, $\eta_d$ is an external derivation quantum efficiency, and $V_m$ is a mode volume of a resonator. Described specifically, based on the finding that $f_r$ increases in proportion to a square root of the optical output, the optical output is often heightened by increasing an injected current (bias current) in order to improve response characteristics.

It is, however, known that an increase in the injected current leads to an increase in the current density (current per unit area) in a light emitting region, which adversely affects the life characteristics of the device. For preventing such an influence, there may be a method of widening the diameter of a current confining portion to lower the effective current density. As can be understood from the above-described equation, however, the method increases a mode volume $V_m$ of a resonator and does not contribute to a substantial improvement in the response characteristics.

From another standpoint, there is a danger of the optical output exceeding the safe standards called "Eye Safe" owing to its increase. According to JIS C 6802 in which safety standards of laser products are specified, a laser with a wavelength of 850 nm having an optical output of 0.78 mW or less belongs to Class I (safety level: exposure to 30000 seconds (=8 hours) does not cause any damage to eyes). If the laser may exceeds this safety level, an additional device such as monitor device for monitoring or limiting the optical output or a shielding plate for preventing optical leakage must be incorporated in a system or module.

Here, $f_r$ can be represented by another equation:

$$f_r = \frac{1}{2\pi} \sqrt{\frac{\xi G' S_0}{\tau_p}} \quad (2)$$

-continued $$S_0 = \frac{\tau_p(I_0 - I_{th})}{eV_a} \quad (3)$$

In the equation, G' is a derivation gain coefficient, τp is a photon lifetime, ξ is an optical confinement coefficient, and $S_o$ is a stationary solution of a photon density at an injected current $I_0$. This equation suggests that a substantial improvement in response characteristics can be brought about by lowering of a threshold current $I_{th}$ even when the injected current is equal.

For improving the response characteristics, a method of increasing $f_r$ while narrowing the diameter of a light emitting region (decreasing the volume of an active region), reducing a threshold current and reducing an injected current is presumed to be effective.

The 3dB down cutoff frequency ($f_{3dB}$) which is an indication of a modulation band can be represented by the following equation when the inductive reactance is negligibly small.

$$f_{3dB} = \frac{1}{2\pi CR} \quad (4)$$

This means that the modulation band varies depending on a CR time constant. Narrowing of the diameter of a light emitting region leads to an increase in the element resistance and a reduction in cutoff frequency caused thereby offsets an improvement in the response characteristics. An increase in the element resistance is also undesirable from the viewpoint of driver impedance matching.

With the foregoing problems in view, the present inventors have proceeded with an investigation on a method of improving response characteristics while suppressing an increase in an injected current as much as possible. As a result, the investigation has reached a conclusion that a reduction in a device capacitance and also in a threshold current while maintaining an element resistance without changing the diameter of a light emitting region is effective. It has been found that this can be attained by such a structure that a static capacitance reducing portion having a capacitance component smaller than a junction capacitance is added in series with a pn junction and at the same time, the reflectance of a resonator is heightened as much as possible until it permits this static capacitance reducing portion to play a partial role of a reflective film and extract an optical output.

Structures aimed at reducing the static capacitance of a surface emitting semiconductor laser diode have so far been proposed. Typical structures are a multi-oxide structure and a hybrid confining structure utilizing selective oxidation and proton injection.

In the multi-oxide structure as disclosed in Japanese Patent No. 3116088 and Japanese Published Unexamined Patent Application No. 2003-168845, plural layers of an oxidized portion are formed in a post by inserting plural layers different in an oxidation rate under the same temperature environment. In this method, plural layers different in an aluminum composition ratio are inserted in advance upon crystal growth or plural layers equal in an aluminum composition ratio but different in the film thickness are inserted. A static capacitance is reduced by substantially thickening the film of an insulating region, while controlling the light cladding intensity by increasing an oxidation depth of the oxidized portion only on a side near the active layer compared with that on the other oxidized portion.

In Chih-Hao Chang, "Parasitics and design considerations on oxide-implant VCSELs", IEEE Photon. Technol. Lett., 13, 1274 (2001), disclosed is a laser diode having a hybrid structure in which selective oxidation and ion injection are used in combination. Similar to the above-described multi-oxide structure, this structure also aims at a reduction in the device capacitance by thickening an insulating region.

In the reduction in static capacitance according to the method as described in Japanese Patent No. 3116088 and Japanese Published Unexamined Patent Application No. 2003-168845, it is important to control an aluminum composition ratio in a material used for a semiconductor multilayer film or a thickness of the film with high accuracy to cause a difference in the film depth, so advanced technology is necessary for crystal growth. If there is a difference in the aluminum composition ratio or film thickness between what is formed and what is desired, it has a direct influence on the oxidation depth. Within a plane of a gallium arsenide wafer having a diameter of 2 or 3 inches, such distribution results in fluctuations in the device properties. The above-described method is therefore not suited for mass production from the viewpoint of the yield of the device, when in-plane uniformity is taken into consideration.

In the method as disclosed in Chih-Hao Chang, Parasitics and design considerations on oxide-implant VCSELs, IEEE Photon. Technol. Lett., 13, 1274 (2001), the thickness of an insulating portion formed newly by the proton injection is important. It is, however, indispensable to optimize the energy or dose upon proton injection, thereby controlling the injection depth precisely. Injection conditions must be changed, depending on the composition or thickness of a semiconductor multilayer reflective film so that it takes tremendous time to find conditions suited for practical use. This leads to an increase in the number of steps and may complicate the method.

In the structure or manufacturing method of the VCSEL, a measure permitting a reduction of a device capacitance while being excellent in mass productivity and employing only easy manufacturing steps has not yet been developed.

SUMMARY OF THE INVENTION

The present invention has been made in view of the above circumstances and provides a structure of the VCSEL which does not need troublesome steps for crystal growth or processing, is excellent in mass productivity, and permits a reduction in the device capacitance, and its manufacturing method.

A surface emitting semiconductor laser diode according to an embodiment of the invention includes a substrate, a first reflective layer formed thereover, an active layer formed over the first reflective layer, a second reflective layer formed over the active layer, a first conductive layer having an opening therein and formed over the second reflective layer, and an additional reflective layer formed over the second reflective layer so as to cover the opening. The additional reflective layer is covered, at least at a portion thereof, with a second conductive layer.

BRIEF DESCRIPTION OF THE DRAWINGS

Embodiments of the present invention will be described in detail based on the following figures, wherein:

FIG. 6A illustrates an equivalent circuit of the device capacitance of the conventional selective oxidation type VCSEL and FIG. 6B illustrates an equivalent circuit of the device capacitance of an oxidation selective type VCSEL according to the first embodiment; and FIG. 7 is a table showing the optical refractive index, relative dielectric constant and film thickness of a material constituting an additional reflective film.

DETAILED DESCRIPTION OF THE INVENTION

The embodiments for carrying out the invention will next be described based on accompanying drawings. The surface emitting semiconductor laser diode according to the embodiments may have a post formed over its semiconductor substrate and emit a laser beam from the top portion of the post. The term "mesa" as used herein has the same meaning as the term "post", while the term "film" has the same meaning as the term "layer".

Figure 1A:
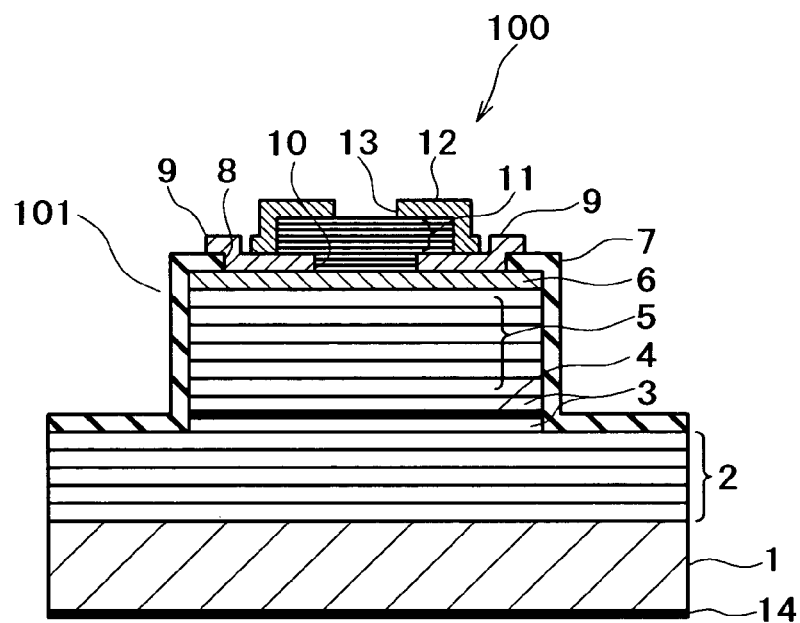
FIG. 1A is a cross-sectional view illustrating a surface emitting semiconductor laser diode according to a first embodiment of the invention and FIG. 1B is its schematic perspective view.
Figure 1B:
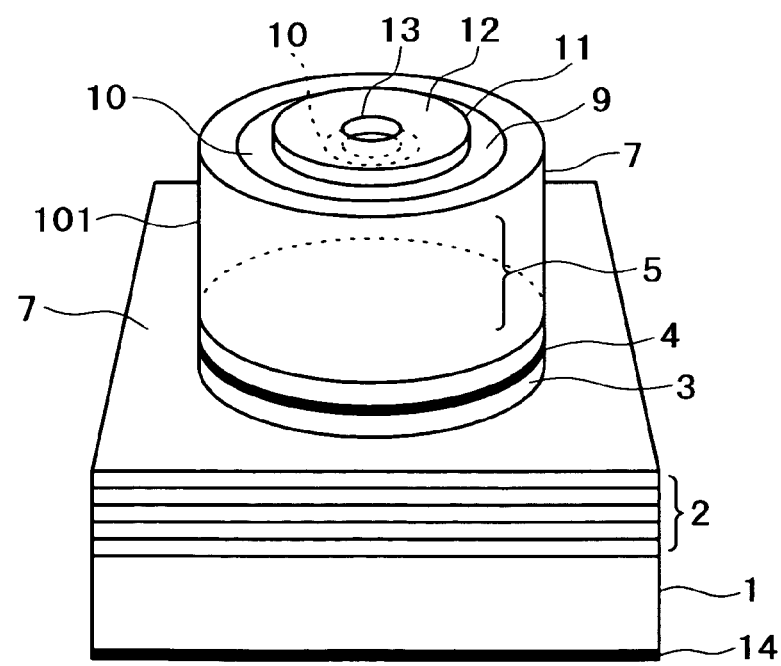

FIG. 1 illustrates the configuration of VCSEL according to a first embodiment of the invention, in which FIG. 1A is its cross-sectional view and FIG. 1B is a schematic perspective view. As illustrated in FIG. 1, a surface emitting semiconductor laser diode 100 has, over an n-type semiconductor substrate 1, an n-type lower multilayer reflective film 2, n-type upper and lower spacer layers 3, an active layer 4 sandwiched between the spacers 3, and a p-type upper multilayer reflective film 5 stacked one after another. The lower and upper multilayer reflective films 2 and 5 serve as a DBR (Distributed Bragg Reflector) mirror. The upper multilayer reflective film 5 has a p-type contact layer 6 in its uppermost layer, and a cylindrical post 101 extending from the contact layer 6 to the spacer 3 is formed. The post 101 is covered and protected, at the side wall and peripheral portion thereof, with the interlayer insulating film 7.

At the top portion of the insulating film 7, a circular contact hole (opening) 8 is formed and a doughnut-shaped p-side contact electrode 9 is positioned in the opening 8. An opening 10 at the center of the contact electrode 9 defines an output area of a laser beam emitted from the active layer 4 of the post 101. The contact electrode 9 is electrically connected to the contact layer 6 and a current necessary for laser oscillation is injected from it.

An annular additional reflective film 11 is formed to cover the opening 10 of the contact electrode 9. The additional reflective film 11 includes plural dielectric films and an additional electrode 12 covering a portion of the upper surface of the dielectric films and at the center of the additional electrode 12, an opening 13 is formed in alignment with the opening 10 of the contact electrode 9. Over the backside of the n-type semiconductor substrate 1, a backside electrode 14 is formed.

The inner side surrounded by the annular contact electrode 9 defines a light emitting region of the laser diode within a plane horizontal to the main surface of the substrate, and the additional reflective film 11 covering the opening 10 of the contact electrode 9 is formed in a direction vertical to the main surface of the substrate so as to partially overlap with at least this light emitting region. The multilayer dielectric films constituting the additional reflective film 11 reflects a portion of a laser beam emitted from the active layer 4 and the remaining portion is radiated outside of the device, passing through the additional reflective film 11.

The additional reflective film 11 constitutes a static capacitance reducing portion in combination with the additional electrode 12 formed on the exposed surface thereof. The additional electrode 12 has, at a portion thereof, protruded toward the inner side of the opening 10 surrounded by the annular contact electrode 9 in a direction vertical to the main surface of the substrate. In short, the diameter of the opening 13 is smaller than that of the opening 10. A portion of the additional electrode 12 is in electrical contact and has continuity with the contact electrode 9.

The additional reflective film 11 is supposed to be a multilayer film made of a dielectric film, because this is a requirement for the constitution of a parallel plate capacitor upon application of a voltage between the additional electrode 12 and the backside electrode 14. The static capacitance (additional capacitance) generated here is inserted in series with the junction capacitance generated at the pn junction formed between the n-type lower multilayer reflective film 2 and the p-type upper multilayer reflective film 5 so that the total capacitance becomes lower than the junction capacitance which is the original device capacitance. In the laser diode structure as illustrated in FIG. 1, the device capacitance can be reduced by use of the additional reflective film 11 and additional electrode 12 in combination, which leads to an improvement of response characteristics.

Formation of the additional reflective film 11 over the upper multilayer reflective film 5 is also advantageous, because the operation check and characteristic evaluation of the device can be carried out even before the formation of the additional reflective film 11. Based on the results, constituent materials, a film thickness and the number of layers of the additional reflective film 11 are selected as needed and a final reflectance can be adjusted to determine, for example, the lowering degree of the maximum light output.

Figure 2A:
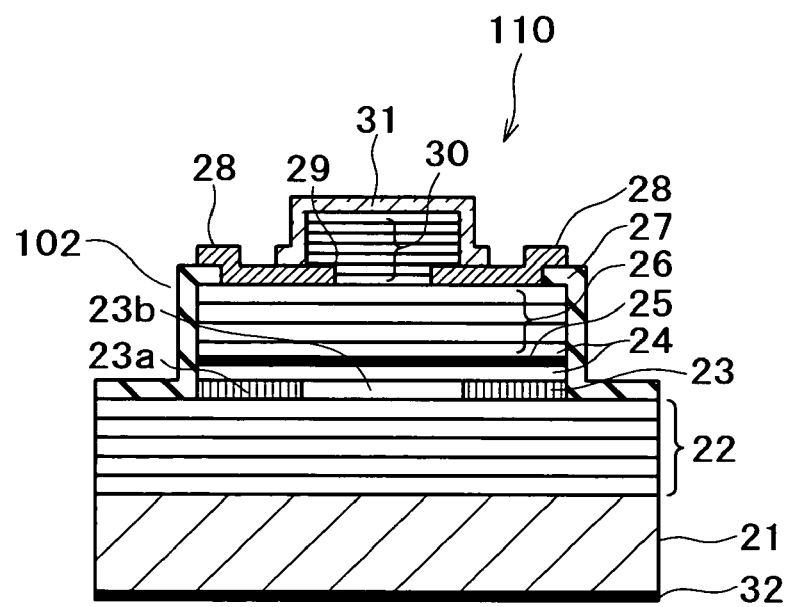
FIG. 2A is a cross-sectional view illustrating a surface emitting semiconductor laser diode according to a second embodiment of the invention and FIG. 2 is its schematic perspective view.
Figure 2B:
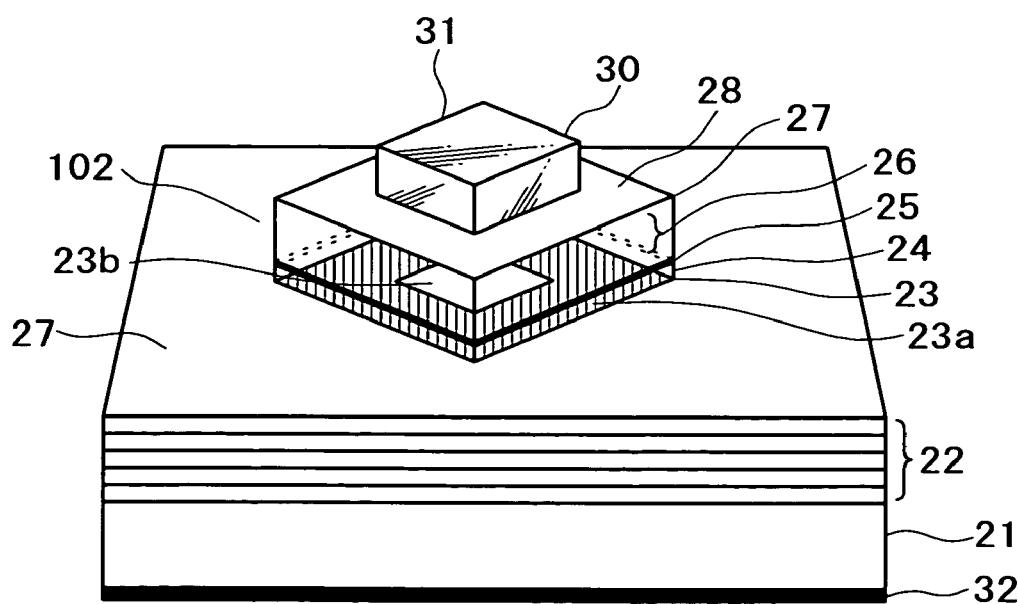

FIG. 2 illustrates the configuration of the VCSEL in accordance with a second embodiment of the invention, in which FIG. 2A is its cross-sectional view and FIG. 2B is a schematic perspective view. A surface emitting semiconductor laser diode 110 according to the second embodiment has a so-called selective oxidation type mesa structure. Over an n-type semiconductor substrate 21, an n-type lower multilayer reflective film 22, a current confining layer 23, a spacer layer 24, an active layer 25, and a p-type upper multilayer reflective film 26 are stacked one after another. The current confining layer 23 has an oxidized portion 23a at the periphery thereof, and a conductive region 23b surrounded by the oxidized portion 23a. A square-shaped mesa 102 extending from the upper multilayer reflective film 26 to the lower multilayer reflective film 22 is formed and the mesa is covered, at the side wall and top portion thereof, with an insulating protective film 27. When the mesa 102 is formed, the side surface of the current confining layer 23 exposed by the mesa 102 is oxidized and the oxidized portion 23b is formed.

At the top portion of the mesa, a contact hole is formed in the insulating protective film 27 to expose the uppermost layer of the upper multilayer reflective film 26. Over the upper multilayer reflective film 26, a rectangular p-side upper electrode 28 for current injection is formed to cover the contact hole. The uppermost layer of the multilayer reflective film 26 may have a p-type contact layer. In the upper electrode 28, an opening 29 is formed in alignment with the conductive region 23b of the current confining layer 23 and an additional reflective film 30 is formed to cover this opening 29. Moreover, to cover the whole additional reflective film 30, a transparent electrode 31 is formed. Over the backside of the n-type substrate 21, a backside electrode 32 is formed.

The inside portion surrounded by the oxidized portion 23a corresponds to the light emitting region of this device in a plane horizontal relative to the main surface of the substrate. The additional reflective film 30 covering the opening 29 of the upper electrode 28 is formed to overlap with at least a portion of this light emitting region in a direction vertical to the main surface of the substrate. The additional reflective film 30 is, at the upper surface and side surface thereof, covered with the transparent electrode 31 having conductivity and it reflects a portion of a laser beam emitted from the active layer. The remaining portion is irradiated outside of the device, passing through the additional reflective film 30 and transparent electrode 31.

As in the first embodiment, a combination of the additional reflective film 30 and the transparent electrode 31 covering it constitutes a static capacitance lowering portion. A portion of the transparent electrode 31 is therefore in electrical contact and has continuity with the upper electrode 28.

The additional reflective film 30 is made of a dielectric multilayer film. The transparent electrode 31 covering it also serves a part of the additional reflective film 30. When a voltage is applied between the annular upper electrode 28 and lower electrode 32, potentials of the upper electrode 28 and transparent electrode 31 become equal because of the conduction therebetween. As a result, a potential difference occurs also between the transparent electrode 31 and the lower electrode 32, whereby a parallel plate capacitor is constituted. As in the first embodiment, a capacitance is added in series, which leads to a reduction in the device capacitance and improvement of the response characteristics.

In addition, the use of the transparent electrode 31 as a part of the additional reflective film 30 saves labor because unlike a metal film, the transparent electrode does not need an opening portion for emitting a laser beam.

The VCSEL according to the first and second embodiments of the invention will next be described more specifically. In the following description, a material name will be indicated by a chemical symbol (atomic symbol or chemical formula).

Figure 3A:
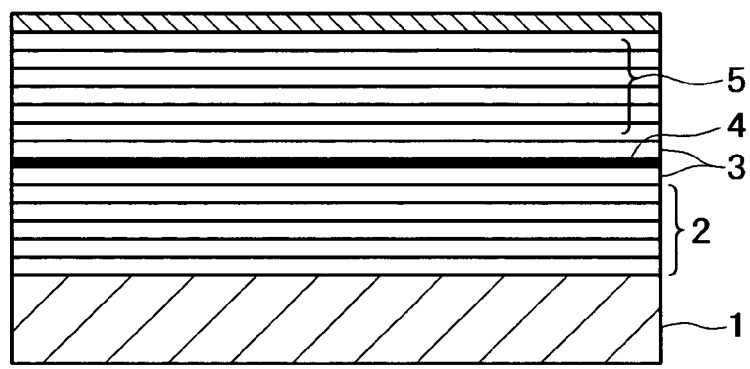
FIGS. 3A to 3C are each a cross-sectional view illustrating the manufacturing step of the surface emitting semiconductor laser diode according to the first embodiment.
Figure 3B:
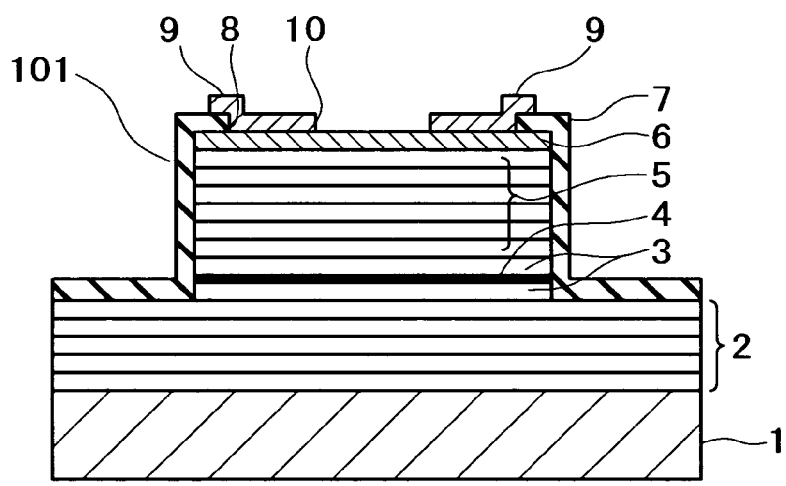
Figure 3C:
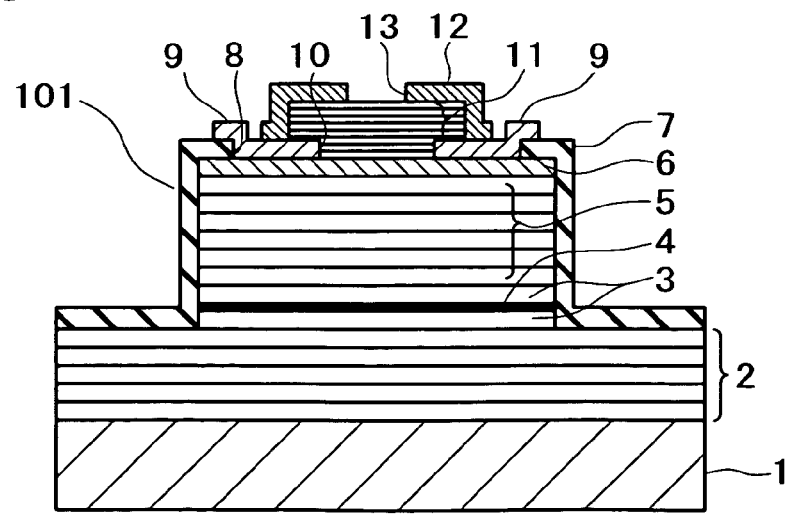

FIGS. 3A to 3C are cross-sectional views for specifically explaining the configuration of the VCSEL according to the first embodiment and manufacturing steps. As illustrated in FIG. 3A, a lower multilayer reflective film 2 formed of a film stack of plural layers of n-type $Al_{0.8}Ga_{0.2}As$ layers and n-type $Al_{0.1}Ga_{0.9}As$ layers, a spacer layer 3 made of an n-type $Al_{0.4}Ga_{0.6}As$ layer, an active layer 4 formed of a film stack of a barrier layer made of an undoped $Al_{0.2}Ga_{0.8}As$ layer and a quantum well layer made of an undoped GaAs layer, and the upper multilayer reflective film 5 formed of a film stack of plural layers of p-type $Al_{0.8}Ga_{0.2}As$ layers and p-type $Al_{0.1}Ga_{0.9}As$ layers are stacked successively over a plane (100) of an n-type GaAs substrate 1 by the metal organic chemical vapor deposition (MOCVD).

Each layer constituting the lower multilayer reflective film 2 corresponds to $\lambda/4n_r$ (in which, $\lambda$ is a wavelength of light emitted from the active layer 4, and $n_r$ is an optical refractive index in a medium). Two layers different in an aluminum composition ratio are stacked alternately at periods of 34.5. The carrier concentration after doping of silicon as an n-type impurity is $5 \times 10^{18}$ cm$^{-3}$.

The active layer 4 obtained by alternately stacking the quantum well active layer made of an undoped GaAs layer and having a thickness of 8 nm and a barrier layer made of an undoped $Al_{0.2}Ga_{0.8}As$ layer and having a thickness of 5 nm (note that it has, as an outer layer, the barrier layer) is placed at the center portion of the spacer layer 3 made of an undoped $Al_{0.4}Ga_{0.6}As$ layer, and the spacer layer 3 including the quantum well active layer and the barrier layer is designed so that the film thickness of the spacer layer is an integral multiples of $\lambda/n_r$. From the active layer 4 having such a constitution, reflected light having a wavelength of 850 nm is available.

The thickness of each layer constituting the upper multilayer reflective film 5 is $\lambda/4n_r$, similar to that of the lower multilayer reflective film 2. Two layers different in an aluminum composition ratio are stacked alternately at periods of 22. The carrier concentration is $4 \times 10^{18}$ cm$^{-3}$ after doping of carbon as a p-type impurity.

The reason why the number of periods of the upper multilayer reflective film 5 is fewer than those of the lower multilayer reflective film 2 is to differentiate the reflectance between them and facilitate extraction of a laser beam from the upper surface of the substrate. Although there is no detailed description herein, an intermediate layer having an intermediate aluminum composition ratio exists between the $Al_{0.8}Ga_{0.2}As$ layer and $Al_{0.1}Ga_{0.9}As$ layer for reducing a serial resistance of the device.

A p-type GaAs layer (contact layer 6) having a thickness of 20 nm is employed as the uppermost layer of the upper multilayer reflective film 5 in order to improve the contact property with a contact electrode 9 which will be described later. The carrier concentration after doping of zinc as a p-type impurity is $1 \times 10^{19}$ cm$^{-3}$.

As illustrated in FIG. 3B, the laser substrate is then taken out from a growth chamber and is etched to form a column (post) having a diameter of 50 µm.

Over the upper surface of the substrate including the exposed side surface of the post, silicon nitride (SiNx) is deposited to give a film thickness of 0.5 µm, followed by the formation of a contact hole 8 at the top of the post. The silicon nitride film having the contact hole therein serves as a protecting film (interlayer insulating film) 7.

The contact electrode 9 formed of a two-layer structure (Ti/Au) of titanium and gold is formed at the top of the post so as to form electrical contact with the p-type GaAs layer (contact layer) 6 formed over the uppermost layer of the upper multilayer reflective film 5. The contact electrode 9 has, at the center thereof, an opening 10 having a diameter of 20 µm for light emission. The contact electrode 9 has a lead-out wire necessary upon mounting, which wire is not illustrated.

As illustrated in FIG. 3C, an additional reflective film 11 is formed near the center of the substrate plane on the top of the post by depositing $TiO_2$ and $SiO_2$ to form a multilayer film made of this film stack, followed by lift-off. Similar to the thickness of the lower multilayer reflective film 2, each layer has a thickness of $\lambda/4n_r$ and it is deposited so as to cover therewith the opening 10 disposed at the center of the contact electrode 9 for light emission.

An additional electrode 12 made of Ti/Au and having an opening 13 at the center of the additional reflective film is then formed so as to cover the additional reflective film 11 partially. The diameter of the opening 13 is adjusted to 10 µm, at which the region of the additional electrode 12 extends inside of the opening 10 having a diameter of 20 μm formed at the center of the contact electrode 9. The outer peripheral portion of the additional electrode 12 extends along the side surface of the additional reflective film 11, is brought into contact with the upper surface of the contact electrode 9 and is electrically connected to the contact electrode 9.

In the final step, a backside electrode 14 (not illustrated) made of a three-layer structure (Au—Ge/Ni/Au) made of gold germanium eutectic, nickel and gold is formed over the backside of the substrate, whereby the VCSEL 100 of the first embodiment as illustrated in FIG. 1 is obtained.

Figure 4A:
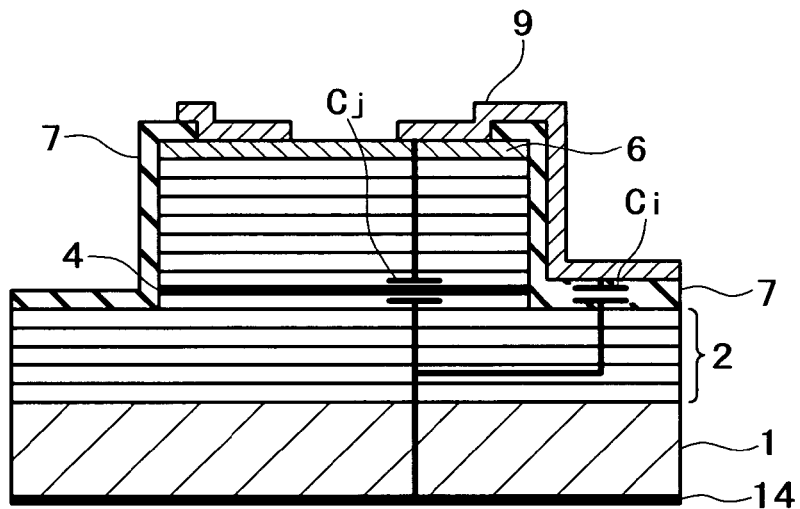
FIG. 4A illustrates an equivalent circuit of the device capacitance of the conventional airpost type VCSEL and FIG. 4B illustrates an equivalent circuit of the device capacitance of the airpost type VCSEL according to the first embodiment.
Figure 4B:
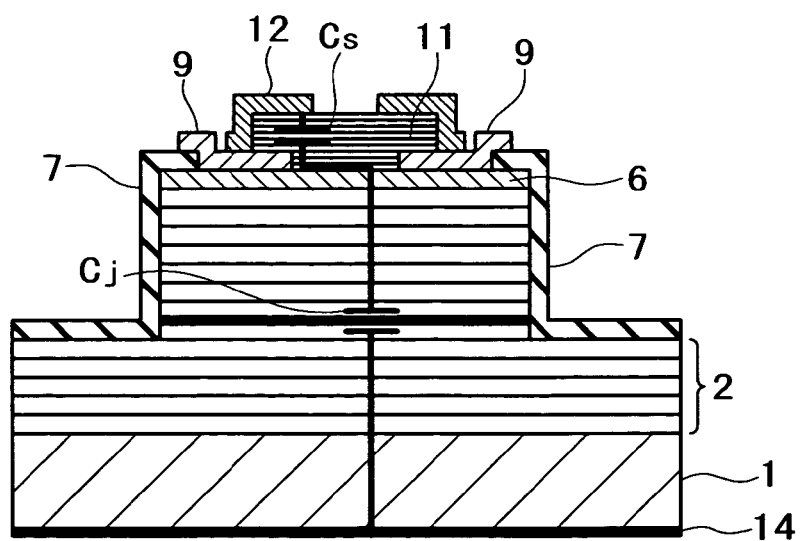

FIG. 4A cross-sectionally illustrates an equivalent circuit of the device capacitance of the conventional airpost VCSEL having an electrode on the upper surface and backside of the substrate. FIG. 4B illustrates an equivalent circuit of the device capacitance of the airpost VCSEL according to the first embodiment. In the conventional airpost type, in addition to a junction capacitance Cj of the pn junction between the lower multilayer reflective film 2 and the upper multilayer reflective film 5, a static capacitance Ci is generated between an electrode lead-out line (including a bonding pad portion) extending over the interlayer insulating film 7 and an n side electrode 14. The device capacitance of the laser diode is a total capacitance of these two capacitance components.

As illustrated in FIG. 4B, the device capacitance of the airpost VCSEL according to the first embodiment is, on the other hand, formed of a pn junction capacitance Cj and a static capacitance Cs of the additional reflective film 11 connected in series therewith.

In the structure of the first embodiment, when a voltage is applied to the contact electrode 9, as soon as carriers are injected into the active layer 4 which will be a light emitting region, the additional electrode 12 having an equal potential to that of the contact electrode 9 constitutes a parallel plate capacitor between the additional electrode and the backside electrode 14 which is on the opposite side of the substrate. The static capacitance Cs generated at this time is inserted in series with the pn junction capacitance Cj so that the total capacitance Cm not including the stray capacitance can be represented by the following equation (5):

$$\frac{1}{C_m} = \frac{1}{C_j} + \frac{1}{C_s} \quad (5)$$

Even Cs>>Cj, the total capacitance Cm does not exceed the pn junction capacitance which the device originally has. In FIG. 4B, the static capacitance Ci may exist by causing the contact electrode 9 or the additional electrode 12 to extend over the interlayer insulating film 7. Even in such a case, the capacitance can be made lower than the capacitance of the laser diode of FIG. 4A.

Figure 5A:
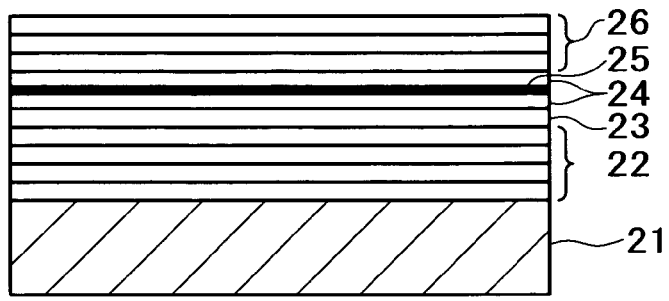
FIGS. 5A to 5D are each a cross-sectional view illustrating the manufacturing step of the surface emitting semiconductor laser diode according to the second embodiment.

The configuration and manufacturing steps of the VCSEL according to the second embodiment of the invention will next be described in further detail referring to the cross-sectional views of FIGS. 5A to 5D. As illustrated in FIG. 5A, a lower multilayer reflective film 22 formed of a film stack of plural layers of an n-type $Al_{0.8}Ga_{0.2}As$ layers and n-type $Al_{0.1}Ga_{0.9}As$ layers, an n-type $Al_{0.98}Ga_{0.02}As$ layer (current confining layer) 23, a spacer layer 24 made of an undoped $Al_{0.4}Ga_{0.6}As$ layer, an active layer 25 formed of a film stack of a barrier layer made of an undoped $Al_{0.2}Ga_{0.8}As$ layer and a quantum well layer made of an undoped GaAs layer, and an upper multilayer reflective film 26 formed of a film stack of plural layers of p-type $Al_{0.8}Ga_{0.2}As$ layers and p-type $Al_{0.1}Ga_{0.9}As$ layers are successively stacked on a plane (100) of an n-type GaAs substrate 21 by molecular beam epitaxy (MBE). When manufacturing steps are similar to those of the first embodiment, a detailed description of them will be omitted as needed.

Each layer constituting the lower multilayer reflective film 22 corresponds to $\lambda/4n_r$ (in which, $\lambda$ is a wavelength of light emitted from the active layer 25 and $n_r$ is an optical refractive index in a medium). Two layers different in an aluminum composition ratio are stacked alternately at periods of 34.5. The number of periods includes the $Al_{0.98}Ga_{0.02}As$ layer 23 disposed as the uppermost layer. The carrier concentration after doping of silicon as an n-type impurity is $5\times10^{18}$ cm$^{-3}$.

The thickness of each layer constituting the upper multilayer reflective film 26 is $\lambda/4n_r$, similar to that of the lower multilayer reflective film 22. The upper multilayer reflective film is obtained by alternately stacking two layers different in an aluminum composition ratio at periods of 17. The carrier concentration after doping of carbon as a p-type impurity is $4\times10^{18}$ cm$^{-3}$.

Figure 5B:
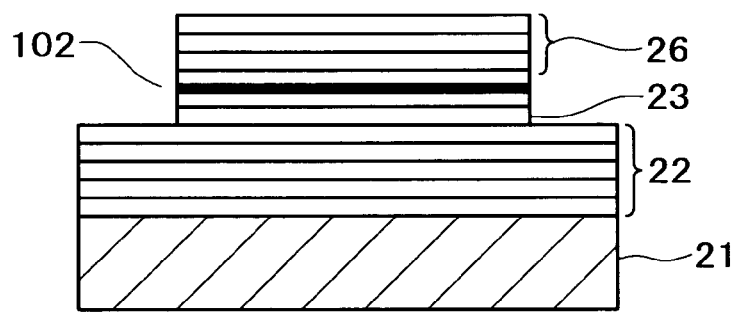

As illustrated in FIG. 5B, the laser substrate is then taken out from a growth chamber and the film stack is etched into a square-shaped mesa 102. The substrate is etched to the depth until the side surface of the $Al_{0.98}Ga_{0.02}As$ layer (current confining layer) 23 constituting the uppermost layer of the lower multilayer reflective film 22 is exposed. In the subsequent oxidation step, the modification of a portion of the $Al_{0.98}Ga_{0.02}As$ layer 23 occurs and the layer is able to serve both as a current confining portion and light cladding portion.

Figure 5C:
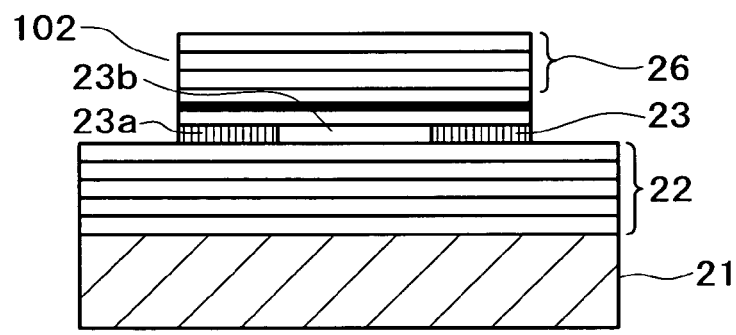

The laser substrate is then exposed to water vapor atmosphere of 340° C. for 30 minutes with nitrogen as a carrier gas (flow rate: 2 liter/min) and as illustrated in FIG. 5C, an oxidized portion 23a is formed from the side surface of the mesa. The $Al_{0.98}Ga_{0.02}As$ layer 23 constituting a portion of the lower multilayer reflective film 22 is oxidized at a remarkably higher rate compared with the $Al_{0.8}Ga_{0.2}As$ layer or $A_{0.1}Ga_{0.9}As$ layer also constituting the portion. Accordingly, just below the active layer 25 in the post, the oxidized portion 23a in the rectangular shape reflecting the shape of the mesa is formed. The oxidized portion 23a acquires a function as a current confining portion owing to a reduction in the conductivity and at the same time, acquires a function as a light cladding portion because the optical refractive index of it is about half ($\leqq1.6$) of that of the semiconductor layers around the oxidized portion. A remained unoxidized portion (conductive region) 23b becomes a current injection portion. The current injection portion surrounded by the oxidized portion 23a is square, 10 μm on a side.

Figure 5D:
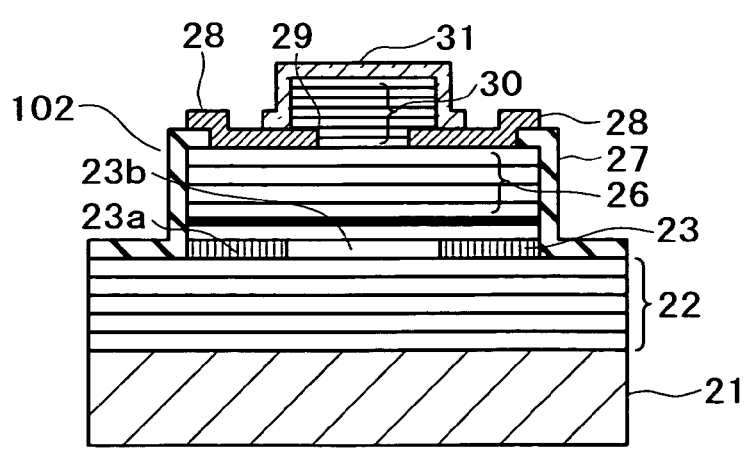

As illustrated in FIG. 5D, a circular or U-shaped upper electrode 28 is formed at the top of the post so as to have an electrical connect with the upper multilayer reflective film 26. An opening 29 enclosed by the upper electrode 28 is circular and has a diameter of 8 μm, smaller than that of the current injection portion 23b or is square whose three sides are substantially linear and have each a length of 6 μm with the remaining one side being opened. The upper electrode 28 is made circular or U-shaped in order to extract a laser beam from the opening portion and to control an emission mode.

To cover the opening 29 formed in the upper electrode 28, a multilayer film formed of a film stack of plural layers of $TiO_2$ and $SiO_2$ is deposited, whereby an additional reflective film 30 is formed near the center on the plane of the substrate at the top of the mesa by the lift-off. Similar to the thickness of the lower multilayer reflective film 22, each layer has a thickness of $\lambda/4n_r$ and the additional reflective film 30 is obtained by alternately stacking two layers different in material. The additional reflective film 30 may cover at least a portion of the light emitting region.

The additional reflective film 30 is covered with a transparent electrode 31 made of indium oxide having tin doped therein (ITO). The transparent electrode 31 constitutes the additional reflective film 30, together with the TiO$_2$ and SiO$_2$ films. At the same time, it has an electrical contact with the upper electrode 28 and serves as a static capacitance lowering portion. Since the static capacitance attributable to this region lowers as the dielectric multilayer reflective film existing below the transparent electrode 31 becomes thicker, it is preferred to increase the number of periods in consideration of the optical output available. In the final step, a backside electrode 32 is formed on the backside of the n-type semiconductor substrate, whereby the VCSEL 110, as illustrated in FIG. 2, according to the second embodiment is obtained.

FIG. 6A cross-sectionally illustrates an equivalent circuit of the device capacitance of the conventional selective oxidation type VCSEL having electrodes on the upper surface and backside of a substrate, while FIG. 6B illustrate an equivalent circuit of the device capacitance of the selective oxidation type VCSEL according to the second embodiment. When the conventional VCSEL is adopted, Cox generated in the oxidized portion 23a insulated by the heat treatment of a semiconductor layer must be taken into consideration in addition to a pn junction capacitance Cj which is a device capacitance generated in the airpost type VCSEL as described in the first embodiment, and a static capacitance Ci generated between an electrode lead-out wire (including a bonding pad) formed over an interlayer insulating film and an n side backside electrode 32. The device capacitance is therefore a total of these three capacitance components.

With regards to the device capacitance generated in the selective oxidation type VCSEL according to the second embodiment, an additional capacitance Cs attributable to the additional reflective film 30 is added in series with a junction capacitance Cj, as illustrated in FIG. 6B. In other words, by the application of a voltage to the upper electrode 28, the transparent electrode 31 equal in potential thereto constitutes a parallel plate capacitor between the transparent electrode and the lower electrode 32. The static capacitance Cs generated at this time is inserted in series with the pn junction capacitance Cj so that as in the first embodiment, the total capacitance Cm can be reduced greatly compared with that of the structure prior to the formation of the additional reflective film 30 and the transparent electrode 31.

A reduction in the capacitance will next be estimated. An optical refractive index, relative dielectric constant and $\lambda/4_n$ film thickness ($\lambda$:>850 nm) of each of TiO$_2$ and SiO$_2$ which are materials constituting the additional reflective film 30 are shown in FIG. 7.

The additional reflective film 30 is a DBR mirror obtained by alternately stacking two materials different in a refractive index one after another. In this embodiment, two materials are stacked at periods of 3 to give a total film thickness of 705 nm. The effective dielectric constant when two materials different in dielectric constant are stacked depends on the material having a larger dielectric constant when there is not a marked difference in the film thickness (when the film thickness becomes very thin, the effective dielectric constant asymptotically approaches to the dielectric constant of another material). The effective specific dielectric constant of the multilayer film according to this embodiment is supposed as 100.

The static capacitance attributable to the additional reflective film 30 is limited to a region of the transparent electrode 31 opposite to the lower electrode 32 and its area is equal to that of the opening 29 of the upper electrode 28. In this embodiment, the opening area as calculated from the circular opening 29 having a diameter of 8 µm is about 50 µm$^2$. As a result, the static capacitance C generated between the parallel plate conductors is determined by the following equation (6):

$$C = \frac{\varepsilon_0 \varepsilon_x S}{d} \quad (6)$$

In the equation, $\varepsilon_0$ is a dielectric constant (8.854×10$^{-12}$ F/m) in the vacuum, $\varepsilon_s$ is a relative dielectric constant peculiar to a material, S is an area of a conductor, and d is a distance between conductors. The static capacitance Cs attributable to the additional reflective film 30 is 0.063 pF as a result of calculation based on the above-described equation.

The total capacitance of the original device portion found was Cj+Ci+Cox=1 pF. The Cs is inserted in series with the total capacitance so that the device capacitance Cm of the selective oxidation type VCSEL added with the structure of this embodiment is 0.06 pF as a result of calculation based on the equation. This suggests the Cm is an almost negligible value. According to the second embodiment, the response characteristics of the selective oxidation type VCSEL can be improved greatly.

As described above, the embodiments of the invention make it possible to reduce the total capacitance of the device and improve the response characteristics of the device which depends on the CR time constant only by adopting a simple structure, that is, by adding an additional reflective film or layer formed of a multilayer film made of at least one dielectric film layer and at least one conductive film layer. Moreover, when the number of layers (the number of periods) of the additional reflective film is increased to heighten the total thickness of dielectric films, the total capacitance shows a further decrease and at the same time, a reflectance of a resonator increases and a threshold current lowers, which leads to an improvement in both the response characteristics and reliability of the device. Monitoring or a shielding plate for satisfying the Eye Safe Standards can be omitted when the number of layers (the number of periods) of the additional reflective film is optimized and a reflectance is set so that the maximum optical output is below the Eye Safe Standards. In this manner, a VCSEL with good response characteristics can be obtained stably with high reproducibility.

In the first embodiment, the post 101 was cylindrical, while in the second embodiment, the mesa 102 was square-shaped. Their shape does not correspond to the constitution of the static capacitance reducing portion and the shape has no relationship with the nature of the invention so that the shape can be selected as needed within an extent not departing from the operation principle of the invention.

In the first and second embodiments, of two sides separated by the active layer, a side far from the substrate is a p-type and the other side near the substrate is an n-type, however, the present invention is not limited to this, and the conductivity may be reversed. The VCSELs in accordance with the first and second embodiments are each a GaAs compound laser diode, but it may be a gallium nitride or gallium indium type laser diode. The emission wavelength can be changed as needed, depending on what compound is used.

In the first and second embodiments, TiO$_2$ and SiO$_2$ (or ITO as the uppermost layer) are used in combination as a material constituting each of the additional reflective films 11 and 30. In the invention, the material is not limited thereto, and alternatively, SnO$_2$ can be used as the conductive film, while ZnO, MgO or Al$_2$O$_3$ can be used as the dielectric film.

In the second embodiment, an $Al_{0.98}Ga_{0.02}As$ layer was used as the current confining layer 23 which became, after the oxidation step, a current confining and light cladding portion. The material of the current confining layer is not limited thereto, and it may be an AlAs layer free of gallium or a material matched to the semiconductor substrate and having an oxidation rate sufficiently higher than the surrounding semiconductor layer. The current confining layer 23 is inserted below the spacer 24 in the second embodiment, but it may be inserted above the spacer 24 or may be inserted both below and above.

In the second embodiment, the opening 29 formed in the upper electrode 28 was smaller than that of the light emitting region 23b surrounded by the oxidized portion 23a of the current confining layer 23 obtained by selective oxidation. The invention is not limited thereto, and the diameter of the opening 29 in the upper electrode 28 may be made greater than that of the light emitting region 23b.

In the embodiments of the invention, the additional reflective film partially overlaps with at least a portion of the light emitting region in a direction vertical to the main surface of the substrate in order to control the optical output. The additional reflective film may be formed to cover the whole light emitting region or to cover at the center portion or a portion at the periphery of the light emitting region. It is also possible to form the additional reflective film only near the central axis of the light emitting region, control only the fundamental mode having a high light intensity in the vicinity of the central axis and impart it with a controlling function of the emission mode.

As described above, a surface emitting semiconductor laser diode according to one embodiment of the invention may include a substrate, a first reflective layer formed thereover, an active layer formed over the first reflective layer, a second reflective layer formed over the active layer, a first conductive layer having an opening therein and formed over the second reflective layer, and an additional reflective layer formed over the second reflective layer so as to cover the opening. The additional reflective layer is covered, at least at a portion thereof, with a second conductive layer.

The additional reflective layer may have a multilayer structure containing at least one dielectric layer and at least one second conductive layer. The second conductive layer may be a transparent film allowing light emitted from the active layer to pass through. The transparent film may be made of, for example, an oxide-containing material. The additional reflective layer may be formed of a dielectric multilayer film obtained by alternately stacking titanium oxide ($TiO_2$) and silicon oxide ($SiO_2$) and a tin-doped indium oxide (ITO) formed over the dielectric multilayer film.

An additional capacitance may be formed between the second conductive layer and the first conductive layer. It may be connected in series with a junction capacitance formed between the first reflective layer of a first conductivity type and the second reflective layer of a second conductivity type. The substrate may be a semiconductor substrate of the first conductivity type and it has an electrode layer formed on the backside thereof. When a voltage is applied between the electrode layer and both of the first and second conductive layers, the device capacitance lowers by the additional capacitance, which improves response characteristics of the device.

A manufacturing method of a surface emitting semiconductor laser diode according to another embodiment of the present invention may include forming, over a substrate, plural semiconductor layers including a first semiconductor multilayer reflective film, a second semiconductor multilayer reflective film, and an active layer sandwiched between the first and second semiconductor multilayer reflective films, forming a first conductive film over the second semiconductor multilayer reflective film, and forming an additional reflective film over the first conductive film. The additional reflective film has at least one dielectric film and a second conductive film covering therewith at least a portion of the dielectric film.

According to the above embodiments of the present invention, in addition to the first and second reflective layers having the active layer therebetween, an additional reflective layer (third reflective layer) is formed over the second reflective layer and a second conductive layer is formed so that a voltage can be applied to the additional reflective layer as well as the pn junction by the first and second reflective layers. The second conductive layer covers at least a portion within an output plane of an output opening portion defined by at least the first conductive layer (preferably, contact electrode or upper electrode) disposed between the second reflective layer and the additional reflective layer. By applying a voltage simultaneously to the first conductive layer and the additional reflective layer including the dielectric film, the capacitance component attributable to the additional reflective layer is inserted in series to the pn junction, which lowers the total capacitance of the device portion and improves the response characteristics of the device limited by a CR time constant.

The second conductive layer covering therewith the additional reflective layer has continuity with the first conductive layer to be used for current injection and is equal in potential. By forming the bottom layer of the additional reflective layer from a dielectric film, this region does not substantially become a current pathway and there is no fear of an increase in element resistance or operating current. Without a change in the current density, the life property of the device is not influenced at all. In addition, the threshold current lowers owing to the heightening of the reflectance of the second reflective layer brought by the existence of the additional reflective layer, which leads to an improvement of response characteristics.

If a mirror reflectance is set so that the maximum optical output of the device itself falls below the Eye Safe Standards, a monitoring device or shielding plate, which has been installed to satisfy the standards, can be omitted.

Formation of the additional reflective layer as a multilayer film including at least one conductive layer makes it unnecessary to form an electrode which covers the additional reflective layer and in addition, such an additional reflective layer can be utilized as a passivation film of the device after the process.

The surface emitting semiconductor laser diode according to the above embodiments of the invention is arranged over a semiconductor substrate in the form of a single or two-dimensional array and can be utilized as a light source for optical communication or optical recording.

It should be noted that these embodiments are given only exemplarily and the scope of the invention is not construed by them in a limiting sense. It is needless to say that another method can also actualize such an advantage within a scope satisfying the requirements of the invention.

The entire disclosure of Japanese Patent Application No. 2004-158747 filed on May 28, 2004 including specification, claims, drawings and abstract is incorporated herein by reference in its entirety.

What is claimed is:

1. A surface emitting semiconductor laser diode, comprising:
   a substrate;

a first reflective layer formed over the substrate;

an active layer formed over the first reflective layer;

a second reflective layer formed over the active layer;

a first conductive layer having an opening therein and formed over the second reflective layer; and an additional reflective layer formed over the second reflective layer so as to cover the opening, wherein the additional reflective layer is covered, at least at a portion thereof, with a second conductive layer, and the second conductive layer is electrically connected to the first conductive layer.

2. The surface emitting semiconductor laser diode according to claim 1, wherein the additional reflective layer has a multilayer structure containing at least one dielectric layer and at least one second conductive layer.

3. The surface emitting semiconductor laser diode according to claim 1, wherein the second conductive layer is a transparent film allowing light emitted from the active layer to pass through.

4. The surface emitting semiconductor laser diode according to claim 3, wherein the transparent film is made of an oxide-containing material.

5. The surface emitting semiconductor laser diode according to claim 1, wherein the additional reflective layer contains a dielectric multilayer film obtained by alternately stacking titanium oxide ($TiO_2$) and silicon oxide ($SiO_2$), and a tin-doped indium oxide (ITO) formed over the dielectric multilayer film.

6. The surface emitting semiconductor laser diode according to claim 1, wherein an additional capacitance is formed between the second conductive layer and the first conductive layer.

7. The surface emitting semiconductor laser diode according to claim 6, wherein the additional capacitance is connected in series with a junction capacitance formed between the first reflective layer of a first conductivity type and the second reflective layer of a second conductivity type.

8. The surface emitting semiconductor laser diode according to claim 1, wherein at least one of the first and second reflective layers contains a current confining layer having an oxidized portion at a periphery of a conductive region.

9. The surface emitting semiconductor laser diode according to claim 8, wherein the opening of the first conductive layer is aligned with the conductive region of the current confining layer and a diameter of the opening is smaller than that of the conductive region.

10. The surface emitting semiconductor laser diode according to claim 9, wherein the second conductive layer has an opening aligned with the opening of the first conductive layer.

11. The surface emitting semiconductor laser diode according to claim 1, wherein the first and second reflective layers are each a film stack obtained by alternately stacking $Al_xGa_{1-x}As$ layers different in an aluminum composition ratio x, where x satisfies the following inequality:

$0<x<1$.

12. The surface emitting semiconductor laser diode according to claim 9, wherein at least a post extending from the second reflective layer to the current confining layer is formed over the substrate and the oxidized portion of the current confining layer is formed by the oxidation from a side surface of the post.

13. The surface emitting semiconductor laser diode according to claim 7, wherein the substrate is a semiconductor substrate of the first conductivity type; a first electrode layer is formed over a backside of the semiconductor substrate; and a voltage is applied between the first electrode layer and both of the first and second conductive layers.

* * * * *